(12) United States Patent
Chen et al.

(10) Patent No.: US 10,985,054 B2
(45) Date of Patent: Apr. 20, 2021

(54) INTERCONNECT STRUCTURE AND METHOD OF FORMING THE SAME

(71) Applicant: Taiwan Semiconductor Manufacturing Co., Ltd., Hsinchu (TW)

(72) Inventors: Jeng-Shiou Chen, Kaohsiung (TW); Chih-Yuan Ting, Taipei (TW); Jyu-Horng Shieh, Hsinchu (TW); Minghsing Tsai, Chu-Pei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 16/927,204

(22) Filed: Jul. 13, 2020

(65) Prior Publication Data

US 2020/0343128 A1 Oct. 29, 2020

Related U.S. Application Data

(60) Continuation of application No. 16/409,919, filed on May 13, 2019, now Pat. No. 10,714,383, which is a division of application No. 15/894,137, filed on Feb. 12, 2018, now Pat. No. 10,290,538, which is a continuation of application No. 15/213,173, filed on
(Continued)

(51) Int. Cl.
| | |
|---|---|
| *H01L 21/768* | (2006.01) |
| *H01L 23/532* | (2006.01) |
| *H01L 23/522* | (2006.01) |
| *H01L 23/528* | (2006.01) |

(52) U.S. Cl.
CPC ...... *H01L 21/7682* (2013.01); *H01L 21/7681* (2013.01); *H01L 21/7684* (2013.01); *H01L 21/76816* (2013.01); *H01L 21/76819* (2013.01); *H01L 21/76831* (2013.01); *H01L 21/76835* (2013.01); *H01L 21/76877* (2013.01); *H01L 23/522* (2013.01); *H01L 23/528* (2013.01); *H01L 23/5226* (2013.01); *H01L 23/5329* (2013.01); *H01L 23/53295* (2013.01); *H01L 21/76807* (2013.01); *H01L 23/53223* (2013.01); *H01L 23/53238* (2013.01);
(Continued)

(58) Field of Classification Search
CPC ........... H01L 21/7682; H01L 21/02274; H01L 23/53295; H01L 2224/48465
See application file for complete search history.

(56) References Cited

U.S. PATENT DOCUMENTS

| | | |
|---|---|---|
| 6,078,088 A | 6/2000 | Buynoski |
| 6,468,894 B1 | 10/2002 | Yang et al. |

(Continued)

*Primary Examiner* — Zandra V Smith
*Assistant Examiner* — John M Parker
(74) *Attorney, Agent, or Firm* — Slater Matsil, LLP (57) ABSTRACT

An interconnect structure and a method of forming an interconnect structure are disclosed. The interconnect structure includes a lower etch stop layer (ESL); an upper low-k (LK) dielectric layer over the lower ESL; a first conductive feature in the upper LK dielectric layer, wherein the first conductive feature has a first metal line and a dummy via contiguous with the first metal line, the dummy via extending through the lower ESL; a first gap along an interface of the first conductive feature and the upper LK dielectric layer; and an upper ESL over the upper LK dielectric layer, the first conductive feature, and the first gap.

20 Claims, 5 Drawing Sheets

Related U.S. Application Data

Jul. 18, 2016, now Pat. No. 9,892,960, which is a division of application No. 13/796,499, filed on Mar. 12, 2013, now Pat. No. 9,401,329.

(52) U.S. Cl.
CPC ...... *H01L 23/53252* (2013.01); *H01L 2221/1063* (2013.01); *H01L 2924/0002* (2013.01)

(56) References Cited

U.S. PATENT DOCUMENTS

| | | |
|---|---|---|
| 7,560,375 B2 | 7/2009 | Filippi et al. |
| 7,803,713 B2 | 9/2010 | Chen et al. |
| 8,298,911 B2 | 10/2012 | Lee |
| 2001/0034137 A1 | 10/2001 | Nambu |
| 2002/0081854 A1 | 6/2002 | Morrow et al. |
| 2002/0182869 A1 | 12/2002 | Chen et al. |
| 2004/0087135 A1* | 5/2004 | Canaperi ............ H01L 21/76835 438/628 |
| 2005/0074961 A1 | 4/2005 | Beyer et al. |
| 2005/0263896 A1 | 12/2005 | Lur et al. |
| 2006/0030128 A1 | 2/2006 | Bu et al. |
| 2006/0057835 A1 | 3/2006 | Anderson et al. |
| 2007/0178713 A1 | 8/2007 | Jeng |
| 2008/0182405 A1 | 7/2008 | Liu et al. |
| 2009/0115061 A1 | 5/2009 | Chen |
| 2009/0302473 A1 | 12/2009 | Shibata et al. |
| 2010/0164117 A1 | 7/2010 | Chen |
| 2011/0215477 A1 | 9/2011 | Chen et al. |
| 2014/0027908 A1 | 1/2014 | Tsai et al. |

* cited by examiner

INTERCONNECT STRUCTURE AND METHOD OF FORMING THE SAME

PRIORITY CLAIM AND CROSS-REFERENCE

This patent application is a continuation of U.S. patent application Ser. No. 16/409,919, filed on May 13, 2019, now U.S. Pat. No. 10,714,383, issued Jul. 14, 2020 and entitled "Interconnect Structure and Method of Forming the Same," which is a divisional of U.S. patent application Ser. No. 15/894,137, filed on Feb. 12, 2018, now U.S. Pat. No. 10,290,538, issued May 14, 2019, and entitled "Interconnect Structure and Method of Forming the Same," which is a continuation of U.S. patent application Ser. No. 15/213,173, filed on Jul. 18, 2016 now U.S. Pat. No. 9,892,960, issued Feb. 13, 2018, and entitled "Interconnect Structure and Method of Forming the Same," which is a divisional of and claims priority to U.S. patent application Ser. No. 13/796,499, filed on Mar. 12, 2013, now U.S. Pat. No. 9,401,329, issued Jul. 26, 2016, and entitled "Interconnect Structure and Method of Forming the Same," each application is hereby incorporated by reference herein as if reproduced in its entirety.

BACKGROUND

The fabrication of integrated chips can be broadly separated into two main sections, front-end-of-the-line (FEOL) fabrication and back-end-of-the-line (BEOL) fabrication. FEOL fabrication includes the formation of devices (e.g., transistors, capacitors, resistors, etc.) within a semiconductor substrate. BEOL fabrication includes the formation of one or more metal interconnect layers comprised within one or more insulating dielectric layers disposed above the semiconductor substrate. The metal interconnect layers of the BEOL electrically connect individual devices of the FEOL to external pins of an integrated chip.

As the size of a semiconductor device size decreases, the capacitive coupling between the metal interconnect layers of the BEOL tends to increase since the capacitive coupling is inversely proportional to the distance between the metal interconnect layers. This coupling may ultimately limit the speed of the chip or otherwise inhibit proper chip operation if steps are not taken to reduce the capacitive coupling. Accordingly, a need has developed in the art for an improved method of forming an interconnect structure for an integrated chip.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-6 and 7B are cross-sectional views of the interconnect structure 100' at various stages of fabrication according to various aspects of the present disclosure.

DETAILED DESCRIPTION

The present disclosure relates generally to semiconductor structures, and more particularly, to methods of forming a gap-containing interconnect structure.

It is understood that the following disclosure provides many different embodiments, or examples, for implementing different features of various embodiments. Specific examples of components and arrangements are described below to simplify the present disclosure. These are, of course, merely examples and are not intended to be limiting. For example, the formation of a first feature "over" or "on" a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "under", "lower", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The claimed subject matter is now described with reference to the drawings, wherein like reference numerals are generally used to refer to like elements throughout. In the following description, for purposes of explanation, numerous specific details are set forth in order to provide a thorough understanding of the claimed subject matter. It is evident, however, that the claimed subject matter may be practiced without these specific details. In other instances, structures and devices are illustrated in block diagram form in order to facilitate describing the claimed subject matter. It will be appreciated that 'layer', as used herein, contemplates a region, and does not necessarily comprise a uniform thickness. For example, a layer is a region, such as an area comprising arbitrary boundaries. For another example, a layer is a region comprising at least some variation in thickness.

There is a need for new methods that provide low RC time constants for advanced semiconductor devices, wherein "R" is the resistance of the on-chip wiring and "C" is the effective capacitance between the signal lines and the surrounding conductors in the multilevel interconnection stack.

RC time constants are reduced by lowering the specific resistance of the wiring material, and by using dielectrics with lower dielectric constants, k. Traditional semiconductor fabrication commonly employs silicon dioxide ($SiO_2$) as a dielectric, which has a k of approximately 3.9. Implementation of organic materials to reduce k also reduces the overall BEOL capacitance. Instead of using $SiO_2$ and organic materials, another approach is to implement a gap, such as air, which is provided in the form of a gap-containing interconnect structure. Even a small air gap near the wire results in a significant improvement in the overall k for a structure, e.g., a 10% air gap per edge will reduce the effective k of a dielectric by approximately 15%.

Figure 1A:
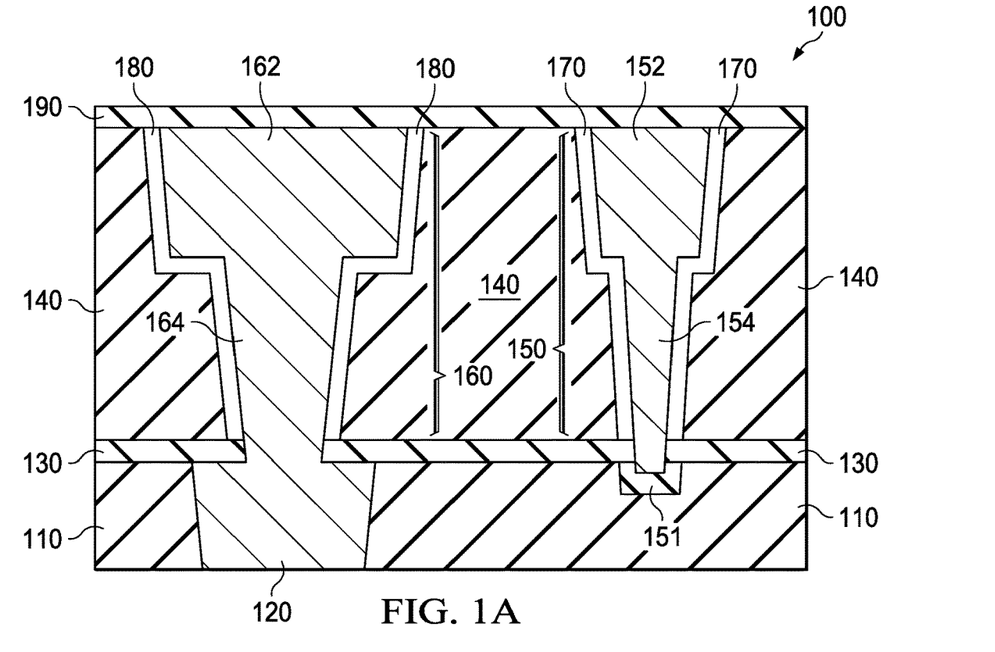
FIG. 1A is a cross-sectional view of an interconnect structure 100 according to various aspects of the present disclosure.

FIG. 1A is a cross-sectional view of an interconnect structure 100 according to various aspects of the present disclosure. As depicted in FIG. 1A, the interconnect structure 100 comprises a lower etch stop layer (ESL) 130; an upper low-k (LK) dielectric layer 140 over the lower ESL 130; a first conductive feature 150 in the upper LK dielectric layer 140, wherein the first conductive feature 150 has a first metal line 152 and a dummy via 154 contiguous with the first metal line 152, the dummy via 154 extending through the lower ESL 130; a first gap 170 along an interface of the first conductive feature 150 and the upper LK dielectric layer 140; and an upper ESL 190 over the upper LK dielectric layer 140, the first conductive feature 150, and the first gap 170. The interconnect structure 100 may further comprise a lower LK dielectric layer 110 below the lower ESL 130; and a lower conductive feature 120 in the lower LK dielectric layer 110. The interconnect structure 100 may further comprise a second conductive feature 160 in the upper LK dielectric layer 140, wherein the second conductive feature 160 has a second metal line 162 and a via 164 contiguous with the second metal line 162, the via 164 extending through the lower ESL 130 and connected to the lower conductive feature 120; and a second gap 180 along an interface of the second conductive feature 160 and the upper LK dielectric layer 140. (A layer 151 will be described later on.)

The material for the lower ESL 130 or the upper ESL 190 includes SiO, SiC, SiN, SiOC, SiON, SiCN, TiN, AlN, AlON, TEOS, hard black diamond (HBD), or the like.

Alternatively, the lower ESL 130 or the upper ESL 190 may be formed by depositing and annealing a metal oxide material, which includes hafnium (Hf), hafnium oxide ($HfO_2$), or aluminum (Al). The lower ESL 130 or the upper ESL 190 may be formed using a suitable process such as atomic layer deposition (ALD), chemical vapor deposition (CVD), physical vapor deposition (PVD), molecular beam epitaxy (MBE), spin-on, or combinations thereof. In some embodiments, the lower ESL 130 or the upper ESL 190 has a thickness in a range from about 10 angstrom (A) to about 300 angstrom (A). In some embodiments, the lower ESL 130 is configured to provide support, such as physical or mechanical support, for the dummy via 154 of the first conductive feature 150 when the first gap 170 is formed.

A dielectric material of the lower LK dielectric layer 110 or the upper LK dielectric layer 140 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PETEOS), fluorine-doped silicon oxide, carbon-doped silicon oxide, porous silicon oxide, porous carbon-doped silicon oxide, organic polymers, or silicone based polymers. For example, the dielectric material is associated with a dielectric constant (k) less than 3.9. In some embodiments, k is between about 1.5 and about 2.8. The lower LK dielectric layer 110 or the upper LK dielectric layer 140 may be formed by ALD, CVD, PVD, or combinations thereof.

In some embodiments, the first conductive feature 150 or the second conductive feature 160 comprises copper (Cu), aluminum (Al), silver (Ag), gold (Au), or alloys thereof. The first conductive feature 150 or the second conductive feature 160 may also comprise one or more barrier layers selected from a group of W, WN, Ti, Al, TiAl, TiN, TiAlN, Ta, TaC, TaN, TaCN, TaSiN, Mn, Zr, Nb, or Ru. The first conductive feature 150 or the second conductive feature 160 may be formed by a process including, but not limited to, ALD, CVD, PVD, sputtering, plating, or combinations thereof. A planarization process, such as a chemical-mechanical planarization/polishing (CMP) process, may be performed to planarize at least one of the upper LK dielectric layer 140, the first conductive feature 150, or the second conductive feature 160.

In some embodiments, the first gap 170 comprises air. In some embodiments, the second gap 180 comprises air. For example, the air gap is associated with a k=1. Accordingly, the air gap of the interconnect structure 100 facilitates improved RC performance with respect to a gap associated with a k higher than 1, for example. However, gap materials other than air are contemplated. In some embodiments, the first gap 170 or the second gap 180 has a width in a range from about 1 Å to about 100 Å.

In some embodiments, the lower conductive feature 120 comprises a third metal line or a gate electrode. The third metal line comprises copper (Cu), aluminum (Al), silver (Ag), gold (Au), or alloys thereof. The third metal line may also comprise one or more barrier layers selected from a group of W, WN, Ti, Al, TiAl, TiN, TiAlN, Ta, TaC, TaN, TaCN, TaSiN, Mn, Zr, Nb, or Ru. In some embodiments, the gate electrode may comprise a single-layer or multilayer structure. In one embodiment, the gate electrode comprises poly-silicon. Further, the gate electrode may be doped poly-silicon with the uniform or non-uniform doping. In an alternative embodiment, the gate electrode comprises a metal selected from a group of W, Cu, Ti, Ag, Au, Al, TiAl, TiAlN, TaC, TaCN, TaSiN, Mn, or Zr. In an alternative embodiment, the gate electrode comprises a metal selected from a group of TiN, WN, TaN, or Ru. In an alternative embodiment, the gate electrode has a thickness in a range from about 30 nm to about 60 nm. The lower conductive feature 120 may be formed using a suitable process such as ALD, CVD, PVD, plating, or combinations thereof.

The interconnect structures of the present disclosure are not limited to the above-mentioned embodiments, and may have other different embodiments. To simplify the description and for the convenience of comparison between each of the embodiments of the present disclosure, the identical components in each of the following embodiments are marked with identical numerals. For making it easier to compare the difference between the embodiments, the following description will detail the dissimilarities among different embodiments and the identical features will not be redundantly described.

Figure 1B:
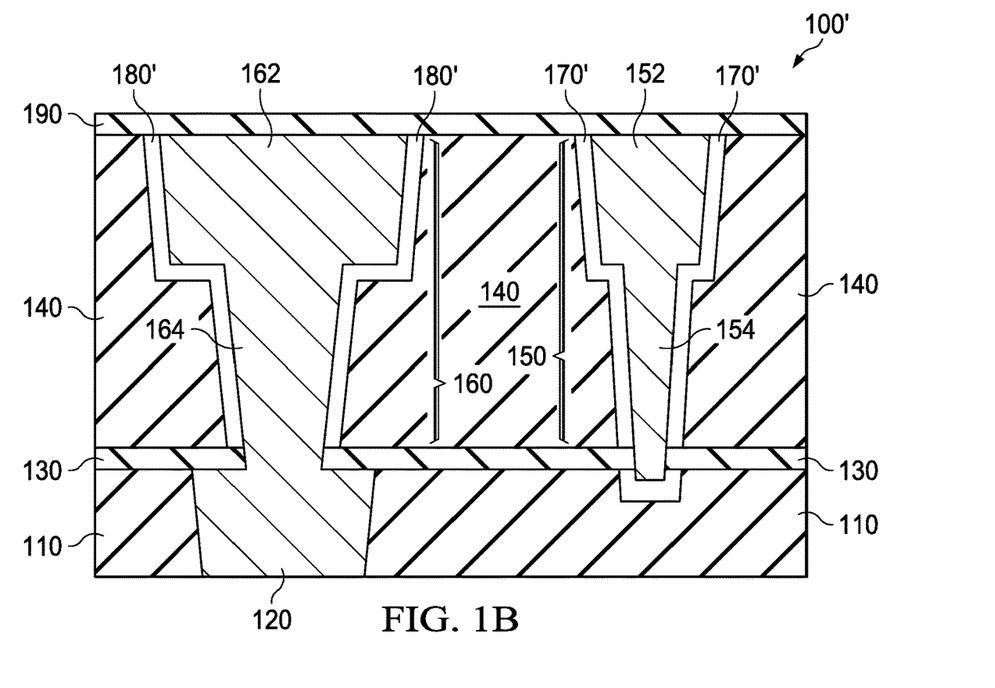
FIG. 1B is a cross-sectional view of an interconnect structure 100' according to various aspects of the present disclosure.

FIG. 1B is a cross-sectional view of an interconnect structure 100' according to various aspects of the present disclosure. FIG. 1B is similar to FIG. 1A except that a bottom surface of a first gap 170' in FIG. 1B is lower than a bottom surface of the first gap 170 in FIG. 1A, and that a bottom surface of a second gap 180' in FIG. 1B is lower than a bottom surface of the second gap 180 in FIG. 1A. In some embodiments, the first gap 170' comprises air. In some embodiments, the second gap 180' comprises air. As depicted in FIGS. 1A and 1B, the bottom surface of the first gap 170 is over the lower ESL 130, while the bottom surface of the first gap 170' is below the lower ESL 130. Similarly, the bottom surface of the second gap 180 is over the lower ESL 130, while the bottom surface of the second gap 180' is substantially coplanar with a bottom surface of the lower ESL 130. The bottom surface of the second gap 180 or the second gap 180' is over the lower conductive feature 120. So, the purpose of the dummy via 154 through the lower ESL 130 is to provide support for the first metal line 152 to prevent it from collapsing when the first gap 170 (or the first gap 170') is formed.

As depicted in FIG. 1A (or FIG. 1B), in some embodiments, the interconnect structure 100 (or the interconnect structure 100') comprises a lower low-k (LK) dielectric layer 110; a lower conductive feature 120 in the lower LK dielectric layer 110; a lower etch stop layer (ESL) 130 over the lower LK dielectric layer 110 and the lower conductive feature 120; an upper LK dielectric layer 140 over the lower ESL 130; a first conductive feature 150 in the upper LK dielectric layer 140, wherein the first conductive feature 150 has a first metal line 152 and a dummy via 154 contiguous with the first metal line 152, the dummy via 154 extending through the lower ESL 130; a second conductive feature 160 in the upper LK dielectric layer 140, wherein the second conductive feature 160 has a second metal line 162 and a via 164 contiguous with the second metal line 162, the via 164 extending through the lower ESL 130 and connected to the lower conductive feature 120; a first gap 170 (or a first gap 170') along an interface of the first conductive feature 150 and the upper LK dielectric layer 140; a second gap 180 (or second gap 180') along an interface of the second conductive feature 160 and the upper LK dielectric layer 140; and an upper ESL 190 over the upper LK dielectric layer 140, the first conductive feature 150, the second conductive feature 160, the first gap 170 (or the first gap 170'), and the second gap 180 (or the second gap 180'). In some embodiments, at least one of the first gap 170 (or the first gap 170') or the second gap 180 (or the second gap 180') comprises air. In some embodiments, a bottom surface of the first gap 170 is over the lower ESL 130, while a bottom surface of the first gap 170' is below the lower ESL 130. In some embodiments, a bottom surface of the second gap 180 or the second gap 180' is over the lower conductive feature 120. In some embodiments, the lower conductive feature 120 comprises a third metal line or a gate electrode.

Figure 2:
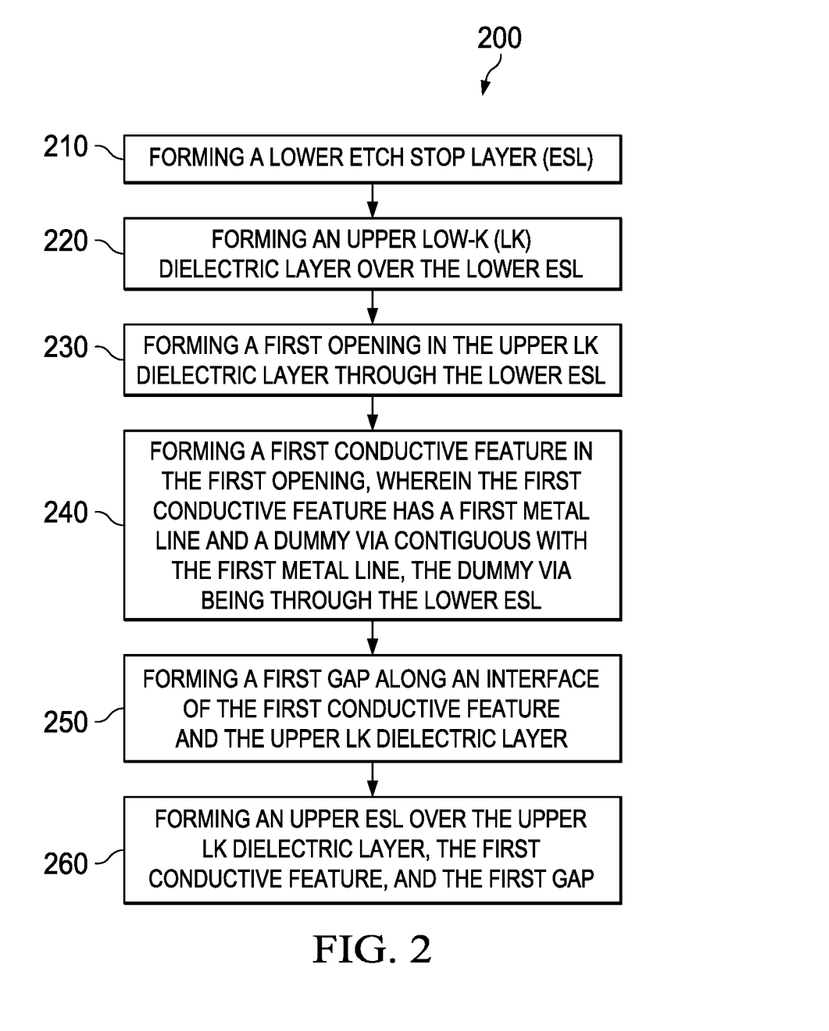
FIG. 2 is a flowchart of a method 200 of forming an interconnect structure 100 (or an interconnect structure 100') according to various aspects of the present disclosure.

FIG. 2 is a flowchart of a method 200 of forming an interconnect structure 100 (or an interconnect structure 100') according to various aspects of the present disclosure. It is understood that additional steps can be provided before, during, and after the method 200, and some of the steps described can be replaced or eliminated for other embodiments of the method 200. The method 200 begins at step 210 in which a lower etch stop layer (ESL) is formed. The method 200 continues with step 220 in which an upper low-k (LK) dielectric layer is formed over the lower ESL. The method 200 continues with step 230 in which a first opening is formed in the upper LK dielectric layer through the lower ESL. The method 200 continues with step 240 in which a first conductive feature is formed in the first opening, wherein the first conductive feature has a first metal line and a dummy via contiguous with the first metal line, the dummy via extending through the lower ESL. The method 200 continues with step 250 in which a first gap is formed along an interface of the first conductive feature and the upper LK dielectric layer. The method 200 continues with step 260 in which an upper ESL is formed over the upper LK dielectric layer, the first conductive feature, and the first gap. The method 200 may further comprise forming a lower LK dielectric layer before the forming the lower ESL; and forming a lower conductive feature in the lower LK dielectric layer. The method 200 may further comprise forming a second opening in the upper LK dielectric layer through the lower ESL; forming a second conductive feature in the second opening, wherein the second conductive feature has a second metal line and a via contiguous with the second metal line, the via extending through the lower ESL and connected to the lower conductive feature; and forming a second gap along an interface of the second conductive feature and the upper LK dielectric layer. The discussion that follows illustrates embodiments of the interconnect structure 100 (or the interconnect structure 100') that can be fabricated according to the method 200 of FIG. 2.

Figure 3:
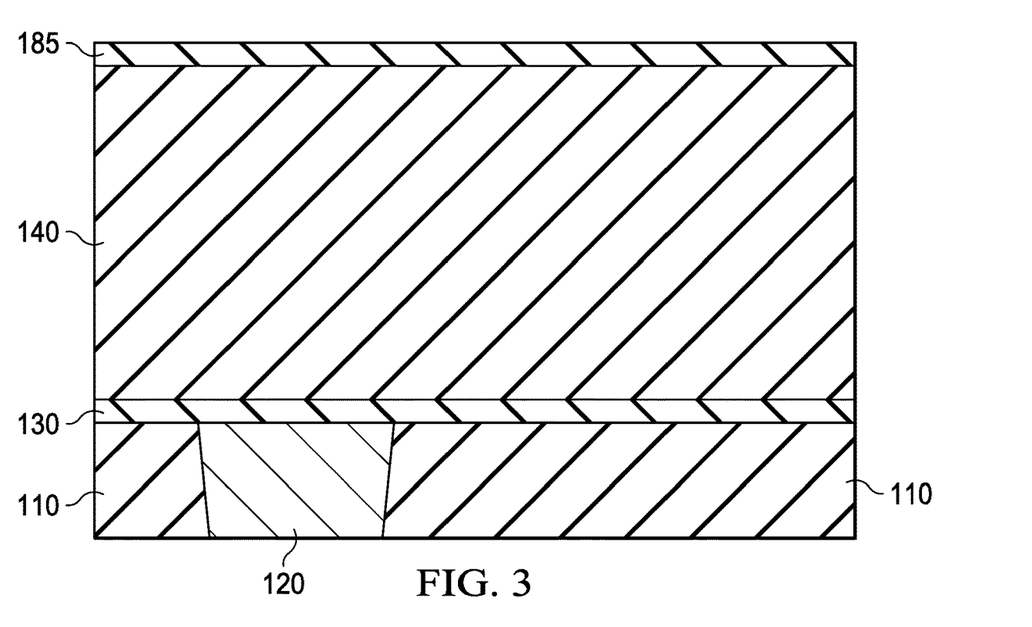
FIGS. 3-6 and 7A are cross-sectional views of the interconnect structure 100 at various stages of fabrication according to various aspects of the present disclosure.

FIGS. 3-6 and 7A are cross-sectional views of the interconnect structure 100 at various stages of fabrication according to various aspects of the present disclosure, while FIGS. 3-6 and 7B are cross-sectional views of the interconnect structure 100' at various stages of fabrication according to various aspects of the present disclosure. As depicted in FIG. 3 and step 210 in FIG. 2, the method 200 begins at step 210 by forming a lower etch stop layer (ESL) 130. The lower ESL 130 may be formed using a suitable process such as ALD, CVD, PVD, molecular beam epitaxy (MBE), spin-on, or combinations thereof. The material for the lower ESL 130 includes SiO, SiC, SiN, SiOC, SiON, SiCN, TiN, AlN, AlON, TEOS, hard black diamond (HBD), or the like. Alternatively, the lower ESL 130 may be formed by depositing and annealing a metal oxide material, which includes hafnium (Hf), hafnium oxide ($HfO_2$), or aluminum (Al). In some embodiments, the lower ESL 130 has a thickness in a range from about 10 Å to about 300 Å.

As depicted in FIG. 3, the method 200 may further comprise forming a lower LK dielectric layer 110 before the forming the lower ESL 130; and forming a lower conductive feature 120 in the lower LK dielectric layer 110. In some embodiments, the lower conductive feature 120 comprises a third metal line or a gate electrode.

As depicted in FIG. 3 and step 220 in FIG. 2, the method 200 continues with step 220 by forming an upper low-k (LK) dielectric layer 140 over the lower ESL 130. After that, a hard mask layer 185 such as TiN may be formed over the upper LK dielectric layer 140. A dielectric material of the lower LK dielectric layer 110 or the upper LK dielectric layer 140 comprises an oxide, $SiO_2$, SiOCH, borophosphosilicate glass (BPSG), TEOS, spin-on glass (SOG), undoped silicate glass (USG), fluorinated silicate glass (FSG), high-density plasma (HDP) oxide, plasma-enhanced TEOS (PE-TEOS), fluorine-doped silicon oxide, carbon-doped silicon oxide, porous silicon oxide, porous carbon-doped silicon oxide, organic polymers, or silicone based polymers. For example, the dielectric material is associated with a dielectric constant (k) less than 3.9. In some embodiments, k is between about 1.5 and about 2.8.

Figure 4:
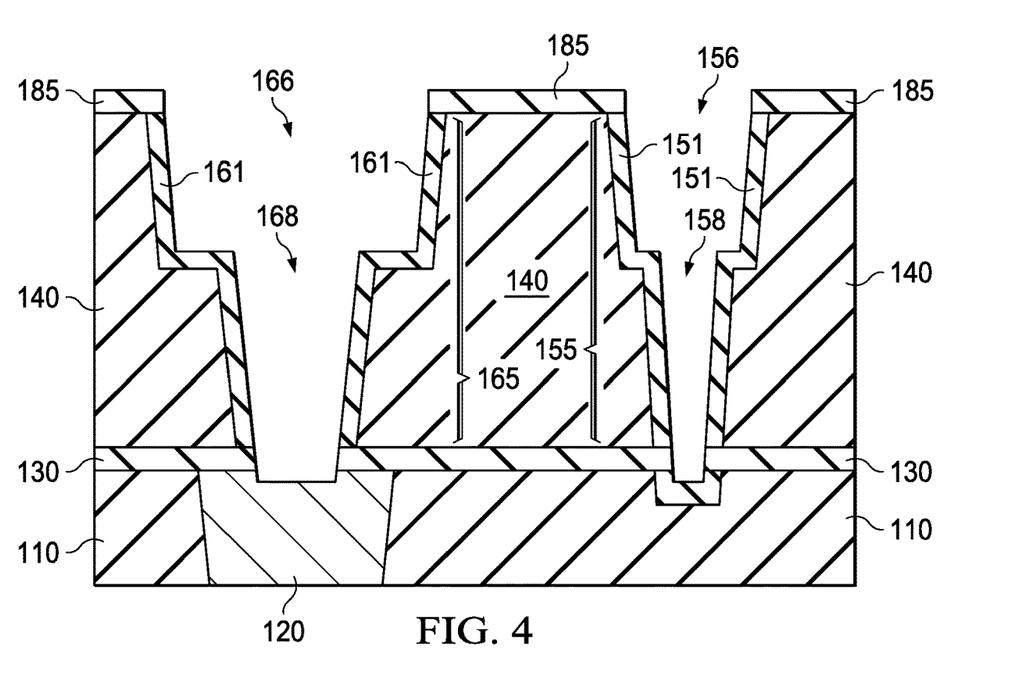

As depicted in FIG. 4 and step 230 in FIG. 2, the method 200 continues with step 230 by forming a first opening 155 in the upper LK dielectric layer 140 through the lower ESL 130. The first opening 155 is formed by a photolithography process (e.g., patterning the hard mask layer 185 first) followed by a dry etching process containing plasma. The dry etching process may be a single step or a multiple step etching process. The dry etching process may be an anisotropic etching process. The dry etching process may use reactive ion etch (RIE) and/or other suitable process. In one example, a dry etching process is used to etch the upper LK dielectric layer 140 that includes a chemistry including fluorine-containing gas. The first opening 155 includes a trench 156 and a dummy via hole 158 through the lower ESL 130. A layer 151 of processed (e.g., plasma damaged) LK dielectric material is formed along a wall of the first opening 155 during the dry etching process. The dry etching process containing plasma makes a carbon concentration of the layer 151 become lower than that of the non-processed LK dielectric material. In some embodiments, the layer 151 has a width in a range from about 1 Å to about 100 Å.

Figure 5:
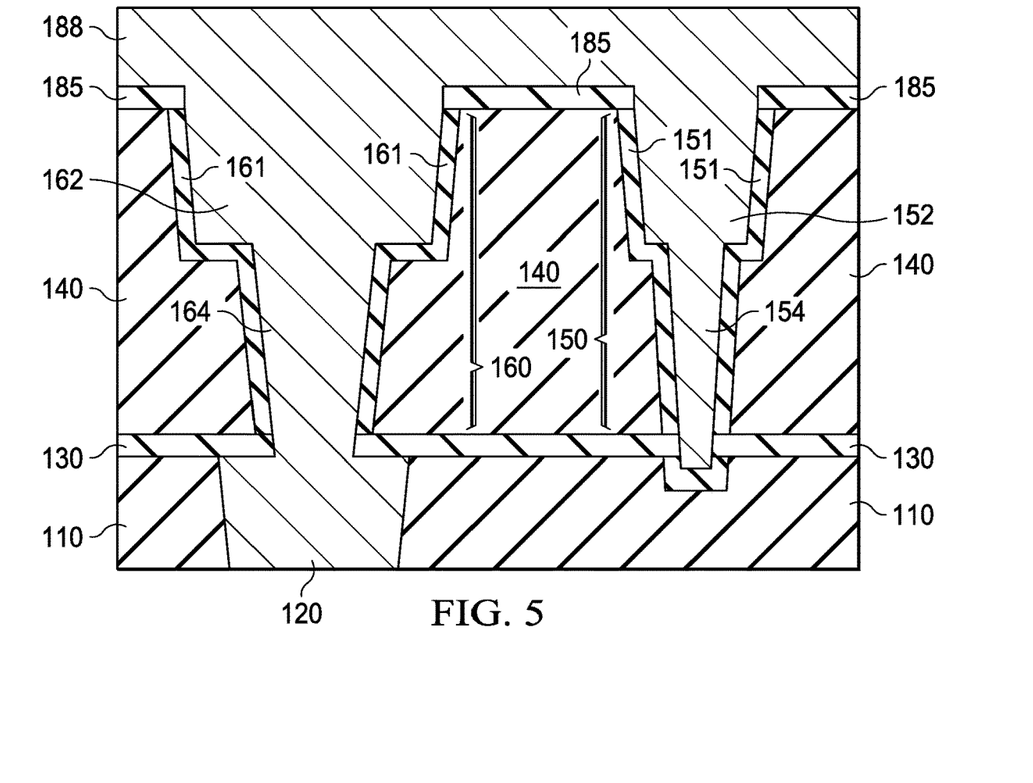
Figure 6:
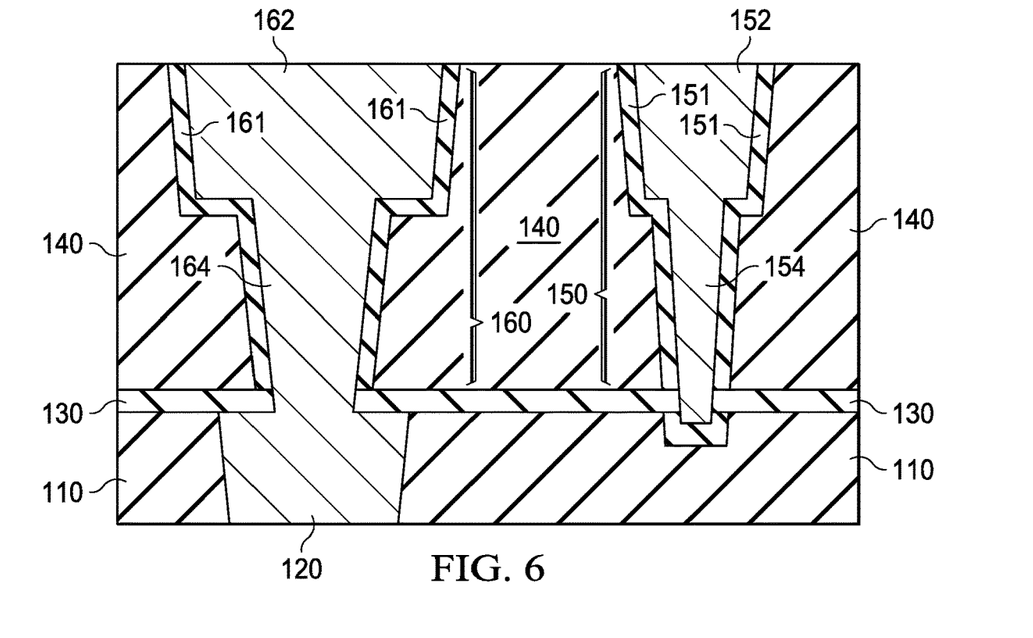

As depicted in FIGS. 5 and 6, and step 240 in FIG. 2, the method 200 continues with step 240 by forming a first conductive feature 150 in the first opening 155, wherein the first conductive feature 150 has a first metal line 152 and a dummy via 154 contiguous with the first metal line 152, the dummy via 154 extending through the lower ESL 130. In some embodiments, the step of forming a first conductive feature 150 in the first opening 155 comprises forming a metal layer 188 in the first opening 155 as shown in FIG. 5, and performing chemical-mechanical planarization (CMP) on at least one of the upper LK dielectric layer 140 or the metal layer 188 as shown in FIG. 6. The metal layer 188 may be formed by a process including, but not limited to, PVD, CVD, sputtering, plating . . . etc. The metal layer 188 comprises copper (Cu), aluminum (Al), silver (Ag), gold (Au), or alloys thereof. The metal layer 188 may also comprise one or more barrier layers selected from a group of W, WN, Ti, Al, TiAl, TiN, TiAlN, Ta, TaC, TaN, TaCN, TaSiN, Mn, Zr, Nb, or Ru.

Figure 7A:
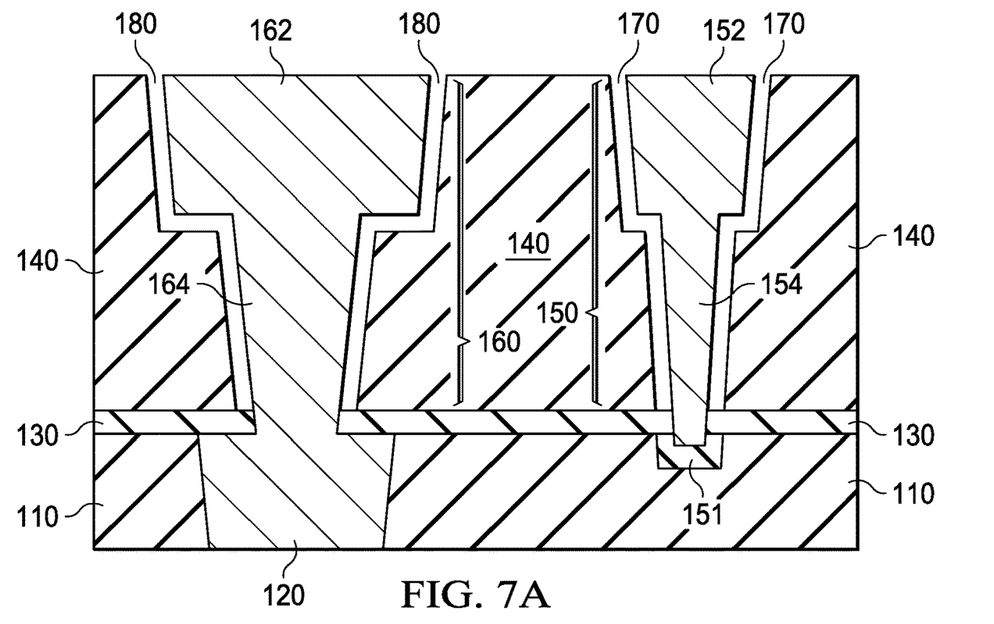
Figure 7B:
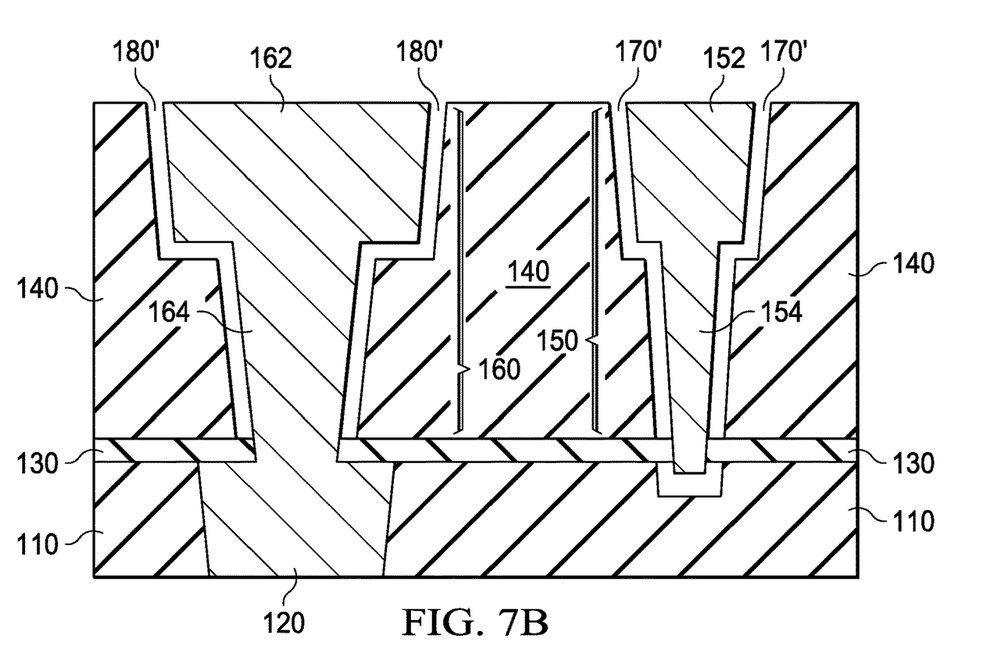

As depicted in FIGS. 7A and 7B, and step 250 in FIG. 2, the method 200 continues with step 250 by forming a first gap 170 (or a first gap 170') along an interface of the first conductive feature 150 and the upper LK dielectric layer 140. In some embodiments, the step of forming a first gap 170 (or a first gap 170') along an interface of the first conductive feature 150 and the upper LK dielectric layer 140 is performed by removing a portion of the upper LK dielectric layer 140 along the interface by a wet etching process. The wet etching process may use a chemical including fluorine-containing species and metal inhibitors. As mentioned above, the layer 151 of processed (e.g., plasma damaged) LK dielectric material is formed along a wall of the first opening 155 during the dry etching process. Actually, the LK dielectric material along the wall of the first opening 155 is associated with a wall etch rate by the wet etching process. Additionally, the LK dielectric material along a top portion of the upper LK dielectric layer 140 is associated with a top etch rate by the wet etching process. Typically, the wall etch rate is different from the top etch rate. For example, processed LK dielectric material is generally associated with a faster etch rate, such as a processed etch rate, than non-processed LK dielectric material associated with a non-processed etch rate, thus making the processed LK dielectric material more easily removable than the non-processed LK dielectric material. Because the carbon concentration of the processed LK dielectric material is lower than that of the non-processed LK dielectric material (caused by the dry etching process containing plasma), the structure of the processed LK dielectric material is weaker and easier to be removed by the wet etching process. For example, the wall etch rate is associated with the processed etch rate, and the top etch rate is associated with the non-processed etch rate. Once the layer 151 of processed LK dielectric material is removed, the first gap 170 (or the first gap 170') is formed along the interface of the first conductive feature 150 and the upper LK dielectric layer 140. In some embodiments, the lower ESL 130 is configured to provide support, such as physical or mechanical support, for the dummy via 154 of the first conductive feature 150.

As depicted in FIGS. 4-7B, the method 200 may further comprise forming a second opening 165 in the upper LK dielectric layer 140 through the lower ESL 130; forming a second conductive feature 160 in the second opening 165, wherein the second conductive feature 160 has a second metal line 162 and a via 164 contiguous with the second metal line 162, the via 164 extending through the lower ESL 130 and connected to the lower conductive feature 120; and forming a second gap 180 (or a second gap 180') along an interface of the second conductive feature 160 and the upper LK dielectric layer 140.

Such as the first opening 155 shown in FIG. 4, the second opening 165 is also formed by a photolithography process (e.g., patterning the hard mask layer 185 first) followed by a dry etching process. The second opening 165 includes a trench 166 and a via hole 168 through the lower ESL 130. A layer 161 of processed (e.g., plasma damaged) LK dielectric material is formed along a wall of the second opening 165 during the dry etching process. In some embodiments, the layer 161 has a width in a range from about 1 Å to about 100 Å.

In some embodiments, the step of forming a second conductive feature 160 in the second opening 165 comprises forming the metal layer 188 in the second opening 165 as shown in FIG. 5, and performing CMP on at least one of the upper LK dielectric layer 140 or the metal layer 188 as shown in FIG. 6.

In some embodiments, the step of forming a second gap 180 (or a second gap 180') along an interface of the second conductive feature 160 and the upper LK dielectric layer 140 is performed by removing a portion of the upper LK dielectric layer 140 along the interface by a wet etching process. As mentioned above, the layer 161 of processed (e.g., plasma damaged) LK dielectric material is formed along a wall of the second opening 165 during the dry etching process. Actually, the LK dielectric material along the wall of the second opening 165 is associated with a wall etch rate by the wet etching process. Additionally, the LK dielectric material along a top portion of the upper LK dielectric layer 140 is associated with a top etch rate by the wet etching process. Typically, the wall etch rate is different from the top etch rate. For example, processed LK dielectric material is generally associated with a faster etch rate, such as a processed etch rate, than non-processed LK dielectric material associated with a non-processed etch rate, thus making the processed LK dielectric material more easily removable than the non-processed LK dielectric material. For example, the wall etch rate is associated with the processed etch rate, and the top etch rate is associated with the non-processed etch rate. Once the layer 161 of processed LK dielectric material is removed, the second gap 180 (or the second gap 180') is formed along the interface of the second conductive feature 160 and the upper LK dielectric layer 140.

FIG. 7B is similar to FIG. 7A except that a bottom surface of a first gap 170' in FIG. 7B is lower than a bottom surface of the first gap 170 in FIG. 7A, and that a bottom surface of a second gap 180' in FIG. 7B is lower than a bottom surface of the second gap 180 in FIG. 7A. The difference between the first gap 170 and first gap 170' (or between the second gap 180 and the second gap 180') can be controlled by the wet etching time. When the wet etching time is short, the processed LK dielectric material over the lower ESL 130 will be removed. When the wet etching time becomes longer, the processed LK dielectric material under the lower ESL 130 will also be removed because the wet chemical can etch through an interface of the dummy via 154 and the lower ESL 130. That's why the bottom surface of the first gap 170 is over the lower ESL 130 while the bottom surface of the first gap 170' is below the lower ESL 130. Similarly, the bottom surface of the second gap 180 is over the lower ESL 130, while the bottom surface of the second gap 180' is substantially coplanar with a bottom surface of the lower ESL 130. The bottom surface of the second gap 180 or the second gap 180' is over the lower conductive feature 120.

As depicted in FIGS. 1A and 1B, and step 260 in FIG. 2, the method 200 continues with step 260 by forming an upper ESL 190 over the upper LK dielectric layer 140, the first conductive feature 150, and the first gap 170 (or the first gap 170'). Similarly, in some embodiments, the upper ESL 190 is formed over the upper LK dielectric layer 140, the second conductive feature 160, and the second gap 180 (or the second gap 180'). The upper ESL 190 may be formed using a suitable process such as ALD, CVD, PVD, MBE, spin-on, or combinations thereof. The material for the upper ESL 190 includes SiO, SiC, SiN, SiOC, SiON, SiCN, TiN, AlN, AlON, TEOS, hard black diamond (HBD), or the like. Alternatively, the lower ESL 130 may be formed by depositing and annealing a metal oxide material, which includes hafnium (Hf), hafnium oxide ($HfO_2$), or aluminum (Al). In some embodiments, the upper ESL 190 has a thickness in a range from about 10 Å to about 300 Å.

The methods of the present disclosure are not limited to be used by a planar device on the substrate and can be applied to a non-planar device as well, such as a fin-like field effect transistor (FinFET). Based on the discussions above, it can be seen that by using the methods of the present disclosure, the dielectric constant (k) of the LK dielectric material is reduced by forming a gap along an interface of the first (or the second) conductive feature and the upper LK dielectric layer. When the gap is formed, the lower ESL is configured to provide support, such as physical or mechanical support, for the dummy via of the first conductive feature. Since processed LK dielectric material is generally associated with a faster etch rate, such as a processed etch rate, than non-processed LK dielectric material associated with a non-processed etch rate, the processed LK dielectric material is more easily removable than the non-processed LK dielectric material. By controlling the wet etching time, the bottom surface of the first gap is either over the lower ESL or below the lower ESL. Similarly, the bottom surface of the second gap is either over the lower ESL or substantially coplanar with a bottom surface of the lower ESL. The bottom surface of the second gap is over the lower conductive feature. As a result, the RC performance of the device can be well controlled by using the methods of the present disclosure.

One of the broader forms of the present disclosure involves an interconnect structure. The interconnect structure comprises a lower etch stop layer (ESL); an upper low-k (LK) dielectric layer over the lower ESL; a first conductive feature in the upper LK dielectric layer, wherein the first conductive feature has a first metal line and a dummy via contiguous with the first metal line, the dummy via extending through the lower ESL; a first gap along an interface of the first conductive feature and the upper LK dielectric layer; and an upper ESL over the upper LK dielectric layer, the first conductive feature, and the first gap.

In some embodiments, the first gap comprises air.

In some embodiments, a bottom surface of the first gap is over the lower ESL.

In some embodiments, a bottom surface of the first gap is below the lower ESL.

In some embodiments, the interconnect structure further comprises a lower LK dielectric layer below the lower ESL; and a lower conductive feature in the lower LK dielectric layer.

In some embodiments, the lower conductive feature comprises a third metal line or a gate electrode.

In some embodiments, the interconnect structure further comprises a second conductive feature in the upper LK dielectric layer, wherein the second conductive feature has a second metal line and a via contiguous with the second metal line, the via extending through the lower ESL and connected to the lower conductive feature; and a second gap along an interface of the second conductive feature and the upper LK dielectric layer.

In some embodiments, the second gap comprises air.

In some embodiments, a bottom surface of the second gap is over the lower conductive feature.

Another of the broader forms of the present disclosure involves an interconnect structure. The interconnect structure comprises a lower low-k (LK) dielectric layer; a lower conductive feature in the lower LK dielectric layer; a lower etch stop layer (ESL) over the lower LK dielectric layer and the lower conductive feature; an upper LK dielectric layer over the lower ESL; a first conductive feature in the upper LK dielectric layer, wherein the first conductive feature has a first metal line and a dummy via contiguous with the first metal line, the dummy via extending through the lower ESL; a second conductive feature in the upper LK dielectric layer, wherein the second conductive feature has a second metal line and a via contiguous with the second metal line, the via extending through the lower ESL and connected to the lower conductive feature; a first gap along an interface of the first conductive feature and the upper LK dielectric layer; a second gap along an interface of the second conductive feature and the upper LK dielectric layer; and an upper ESL over the upper LK dielectric layer, the first conductive feature, the second conductive feature, the first gap, and the second gap.

In some embodiments, at least one of the first gap or the second gap comprises air.

In some embodiments, a bottom surface of the first gap is over the lower ESL.

In some embodiments, a bottom surface of the first gap is below the lower ESL.

In some embodiments, a bottom surface of the second gap is over the lower conductive feature.

In some embodiments, the lower conductive feature comprises a third metal line or a gate electrode.

Still another of the broader forms of the present disclosure involves a method of forming an interconnect structure. The method comprises forming a lower etch stop layer (ESL); forming an upper low-k (LK) dielectric layer over the lower ESL; forming a first opening in the upper LK dielectric layer through the lower ESL; forming a first conductive feature in the first opening, wherein the first conductive feature has a first metal line and a dummy via contiguous with the first metal line, the dummy via extending through the lower ESL; forming a first gap along an interface of the first conductive feature and the upper LK dielectric layer; and forming an upper ESL over the upper LK dielectric layer, the first conductive feature, and the first gap.

In some embodiments, the step of forming a first conductive feature in the first opening comprises forming a metal layer in the first opening; and performing chemical-mechanical planarization (CMP) on at least one of the upper LK dielectric layer or the metal layer.

In some embodiments, the step of forming a first gap along an interface of the first conductive feature and the upper LK dielectric layer is performed by removing a portion of the upper LK dielectric layer along the interface by a wet etching process.

In some embodiments, the method further comprises forming a lower LK dielectric layer before the forming the lower ESL; and forming a lower conductive feature in the lower LK dielectric layer.

In some embodiments, the method further comprises forming a second opening in the upper LK dielectric layer through the lower ESL; forming a second conductive feature in the second opening, wherein the second conductive feature has a second metal line and a via contiguous with the second metal line, the via extending through the lower ESL and connected to the lower conductive feature; and forming a second gap along an interface of the second conductive feature and the upper LK dielectric layer.

One general aspect of embodiments disclosed herein includes a method of forming an interconnect structure, including: forming a lower etch stop layer (ESL); forming an upper low-k (LK) dielectric layer over the lower ESL; forming a first opening in the upper LK dielectric layer through the lower ESL; forming a first conductive feature in the first opening, where the first conductive feature has a first metal line and a dummy via contiguous with the first metal line, the dummy via extending through the lower ESL; forming a first gap along an interface of the first conductive feature and the upper lk dielectric layer; and forming an upper ESL over the upper LK dielectric layer, the first conductive feature, and the first gap.

Another general aspect of embodiments disclosed herein includes a method of forming an interconnect structure, including: forming an opening in a dielectric layer, thereby forming a damaged region of the dielectric layer lining the opening; filling the opening with a conductor; and removing the damaged region, thereby leaving a gap between the dielectric layer and the conductor.

Yet another general aspect of embodiments disclosed herein includes a method of forming an interconnect structure, including: forming a lower conductive structure in a lower low k (LK) dielectric layer; depositing a lower etch stop layer (ESL) over the lower conductive structure and the lower LK dielectric layer; depositing an upper LK dielectric layer over the lower ESL; applying an etching process to the upper LK dielectric layer to form an opening therein, the etching process forming a damaged region of the upper LK dielectric layer lining the opening; filling the opening with a conductor to form a conductive line and a via contiguous with the conductive line, the via extending through the lower ESL; and removing the damaged region of the upper LK dielectric layer to form an air gap between the conductive line and the upper LK dielectric layer and between the via and the upper LK dielectric layer.

The foregoing has outlined features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A interconnect structure, comprising:
   a first dielectric layer;
   a second dielectric layer over the first dielectric layer, the second dielectric layer and the first dielectric layer having different material compositions;
   a third dielectric layer over the second dielectric layer, the third dielectric layer and the second dielectric layer having different material compositions;
   a first conductive feature in the third dielectric layer and extending partially into the first dielectric layer;
   a first gap disposed around the first conductive feature in the third dielectric layer; and
   a second gap disposed around the first conductive feature in the first dielectric layer, wherein a portion of the second dielectric layer is disposed between the first gap and the second gap.

2. The interconnect structure of claim 1, wherein the first conductive feature comprises a line portion and a via portion, a width of the line portion being greater than a width of the via portion, wherein the second gap is disposed around the via portion of the first conductive feature.

3. The interconnect structure of claim 2, wherein the via portion extends partially through the third dielectric layer.

4. The interconnect structure of claim 1, wherein a thickness of the second dielectric layer is less than a thickness of the third dielectric layer.

5. The interconnect structure of claim 1, wherein a bottom surface of the first conductive feature is free from contacting another conductive feature in a cross-sectional view.

6. The interconnect structure of claim 1, wherein the first gap has a width in a range from about 1 Å to about 100 Å.

7. The interconnect structure of claim 6, wherein the second gap has a width in a range from about 1 Å to about 100 Å.

8. An interconnect structure, comprising:
   a first dielectric layer;
   a first etch stop layer (ESL) over the first dielectric layer;
   a second dielectric layer over the first ESL;
   a first conductive feature extending completely through the second dielectric layer and the first ESL into the first dielectric layer;
   a first air gap disposed between the first conductive feature in the second dielectric layer and the second dielectric layer; and
   a second air gap disposed between the first conductive feature in the first dielectric layer and the first dielectric layer, wherein the second air gap extends along a bottom surface of the first conductive feature.

9. The interconnect structure of claim 8, wherein the second air gap extends completely under the first conductive feature in a cross-sectional view.

10. The interconnect structure of claim 8, wherein the first dielectric layer extends completely under the first conductive feature in a cross-sectional view.

11. The interconnect structure of claim 8 further comprising:
    a second conductive feature in the second dielectric layer, wherein the second conductive feature comprises a second metal line and a second via;
    an underlying conductor in the first dielectric layer, wherein the second via extends through the first ESL to the underlying conductor; and a third gap interposed between the second conductive feature and the second dielectric layer.

12. The interconnect structure of claim 11, wherein the first ESL is interposed between the third gap and the underlying conductor.

13. The interconnect structure of claim 11, wherein the first ESL completely separates the third gap from the underlying conductor.

14. The interconnect structure of claim 8, wherein the first ESL physically contacts the first conductive feature.

15. An interconnect structure, comprising:
a first dielectric layer;
a second dielectric layer over the first dielectric layer;
a third dielectric layer over the second dielectric layer;
a first conductive feature extending through the third dielectric layer and the second dielectric layer, the first conductive feature extending only partially into the first dielectric layer, wherein the second dielectric layer contacts the first conductive feature;
a first void disposed between the first conductive feature and the third dielectric layer; and
a second void disposed between the first conductive feature and the first dielectric layer.

16. The interconnect structure of claim 15, wherein the second void exposes a bottom surface of the second dielectric layer.

17. The interconnect structure of claim 15, wherein the second void extends completely under the first conductive feature in a cross-sectional view.

18. The interconnect structure of claim 15, wherein the first void extends under a horizontal surface of the first conductive feature in the third dielectric layer.

19. The interconnect structure of claim 15 further comprising a fourth dielectric layer extending over first conductive feature and the first void, wherein an upper surface of the first conductive feature is level with an upper surface of the third dielectric layer.

20. The interconnect structure of claim 15, wherein the second dielectric layer completely separates the first void from the second void.

* * * * *